(12) United States Patent
Fan

(10) Patent No.: US 11,978,698 B2
(45) Date of Patent: May 7, 2024

(54) METHOD FOR FORMING A SEMICONDUCTOR PACKAGE STRUCTURE

(71) Applicant: CHANGXIN MEMORY TECHNOLOGIES, INC., Hefei (CN)

(72) Inventor: Zengyan Fan, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 59 days.

(21) Appl. No.: 17/647,167

(22) Filed: Jan. 5, 2022

(65) Prior Publication Data
US 2022/0344251 A1 Oct. 27, 2022

Related U.S. Application Data

(63) Continuation of application No. PCT/CN2021/112273, filed on Aug. 12, 2021.

(30) Foreign Application Priority Data

Apr. 23, 2021 (CN) .......................... 202110440019.8

(51) Int. Cl.
*H05K 3/06* (2006.01)
*H01L 21/48* (2006.01)
*H01L 23/498* (2006.01)

(52) U.S. Cl.
CPC .... *H01L 23/49822* (2013.01); *H01L 21/4857* (2013.01); *H05K 3/06* (2013.01)

(58) Field of Classification Search
CPC ......... H01L 23/49822; H01L 23/49838; H01L 21/4857; H05K 3/06; H05K 3/0055; H05K 3/22; Y10T 29/49155; Y10T 29/49165
See application file for complete search history.

(56) References Cited

U.S. PATENT DOCUMENTS

| | | | |
|---|---|---|---|
| 7,557,033 B2 * | 7/2009 | Kim | H01L 21/76834 438/653 |
| 9,875,980 B2 * | 1/2018 | Rinne | H01L 23/49811 |
| 10,586,748 B2 * | 3/2020 | Park | H01L 21/4857 |
| 2008/0003814 A1 | 1/2008 | Kim et al. | |
| 2008/0236872 A1 * | 10/2008 | Kataoka | H05K 3/06 29/829 |

FOREIGN PATENT DOCUMENTS

| | | |
|---|---|---|
| CN | 106057775 A | 10/2016 |
| CN | 106601715 A | 4/2017 |
| CN | 107306477 A | 10/2017 |
| CN | 111128755 A | 5/2020 |
| KR | 20080022383 A | 3/2008 |

OTHER PUBLICATIONS

International search report in application No. PCT/CN2021/112273, dated Dec. 27, 2021.

* cited by examiner

*Primary Examiner* — Donghai D Nguyen
(74) *Attorney, Agent, or Firm* — Syncoda LLC; Feng Ma

(57) ABSTRACT

A method for forming the packaging structure includes: providing a substrate; forming a plurality of mutually independent conductive wires on the substrate, wherein a trench is provided between adjacent conductive wires; oxidizing side walls of each of the conductive wires to form a barrier layer; and forming a solder mask at least filling the trench.

8 Claims, 5 Drawing Sheets

METHOD FOR FORMING A SEMICONDUCTOR PACKAGE STRUCTURE

CROSS-REFERENCE TO RELATED APPLICATION

This is a continuation of International Application No. PCT/CN2021/112273 filed on Aug. 12, 2021, which claims priority of Chinese Patent Application No. 202110440019.8 filed on Apr. 23, 2021. The disclosures of the above-referenced applications are hereby incorporated by reference in their entirety.

BACKGROUND

Performance upgrade of semiconductors requires equal wire lengths of high-speed digital substrates during packaging. In order to keep delay differences of signals transmitted in the substrates within a certain range, and therefore guarantee validity of data read inside the packaging substrates in the same period, higher requirements are imposed on design of the package substrates and various restrictions inside the package substrates, for example, those for wire widths and the wire lengths of routing layers inside the package substrates.

SUMMARY

The disclosure relates generally to the technical field of packaging, and more specifically to a semiconductor package structure and a method for forming thereof.

Some embodiments of the disclosure provide a semiconductor package structure and a method for forming thereof.

According to some embodiments, the disclosure provides the method for forming a semiconductor package structure, the forming method includes:
 a substrate is provided;
 a plurality of mutually independent conductive wires are formed on the substrate, where a trench exposing the substrate is provided between adjacent conductive wires;
 side walls of each of the conductive wires are oxidized to form a barrier layer; and
 a solder mask is formed at least filling the trench.

According to some other embodiments, the disclosure further provides a semiconductor package structure, the semiconductor package structure includes:
 a substrate;
 a plurality of mutually independent conductive wires, located on the substrate, where a trench exposing the substrate is provided between adjacent conductive wires;
 a barrier layer, covering side walls of each of the conductive wires; and
 a solder mask, located on the substrate and at least fills the trench.

DETAILED DESCRIPTION

The following describes specific embodiments of a semiconductor package structure and a method for forming thereof provided by the disclosure in detail with reference to accompanying drawings.

The higher the routing density of the packaging substrates is, the shorter the distance between adjacent wires becomes. Under the highly accelerated stress test (HAST) (reliability test environment), electromigration will occur between wires, leading to a short circuit between adjacent wires and therefore a packaging failure.

Various embodiments of the present disclosure can address how to avoid the short circuit between adjacent wires on the package substrates and improve the performance reliability of packaging structures.

Figure 1:
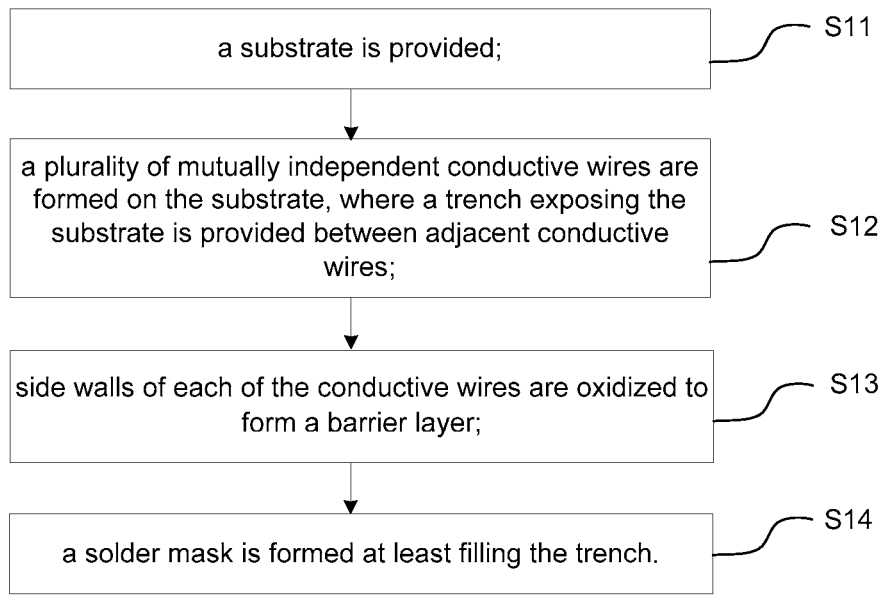
FIG. 1 is a flowchart of a method for forming a semiconductor package structure in an embodiment of the disclosure.
Figure 2A:
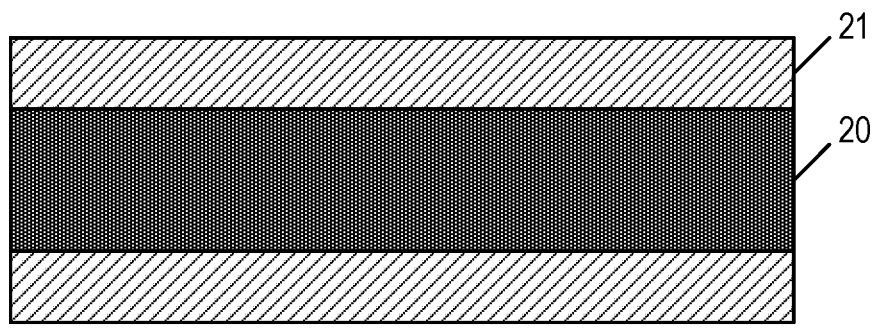
FIG. 2A is a first schematic cross section of main processes during formation of a semiconductor package structure according to an embodiment of the disclosure.
Figure 3:
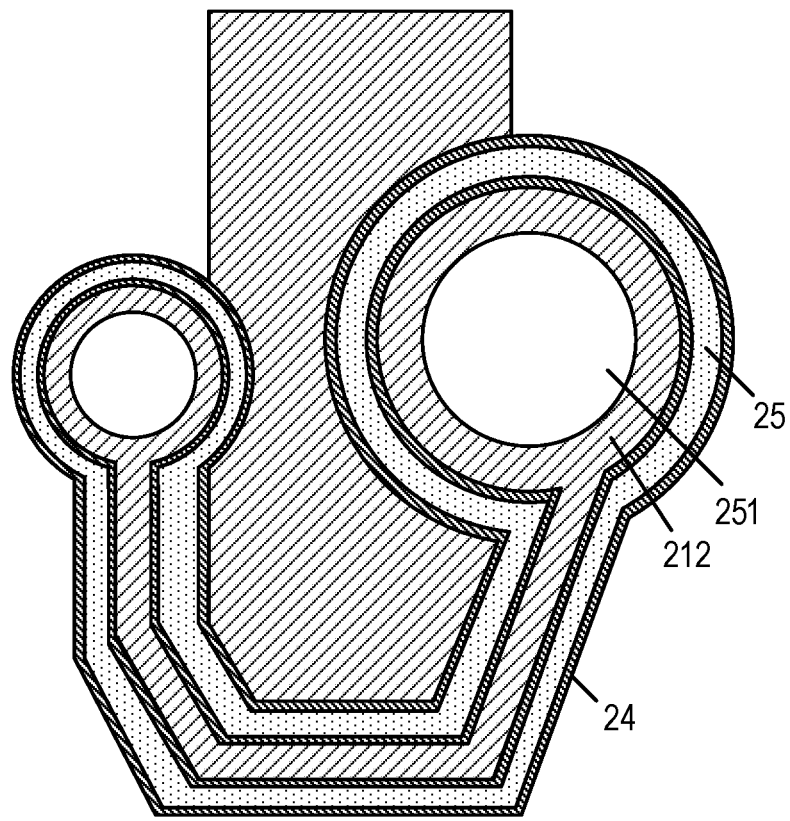
FIG. 3 is a schematic structural diagram of a top view of the semiconductor package structure formed according to an embodiment of the disclosure.

This particular embodiment provides the method for forming a semiconductor package structure. FIG. 1 is a flowchart of a method for forming a semiconductor package structure in an embodiment of the disclosure, FIGS. 2A-2J are schematic cross sections of main processes during formation of a semiconductor package structure according to an embodiment of the disclosure, and FIG. 3 is a schematic structural diagram of a top view of the semiconductor package structure formed according to an embodiment of the disclosure. As shown in FIG. 1, FIGS. 2A-2J and FIG. 3, the method for forming a semiconductor package structure provided by this particular embodiment includes:

S11, a substrate 20 is provided, as shown in FIG. 2A.

The substrate 20 may be made from insulation materials, which include, but are not limited to, resin. A routing layer may be formed on a surface of the substrate 20 and inside the substrate 20, and the routing layer is used for transmitting signals.

Figure 2B:
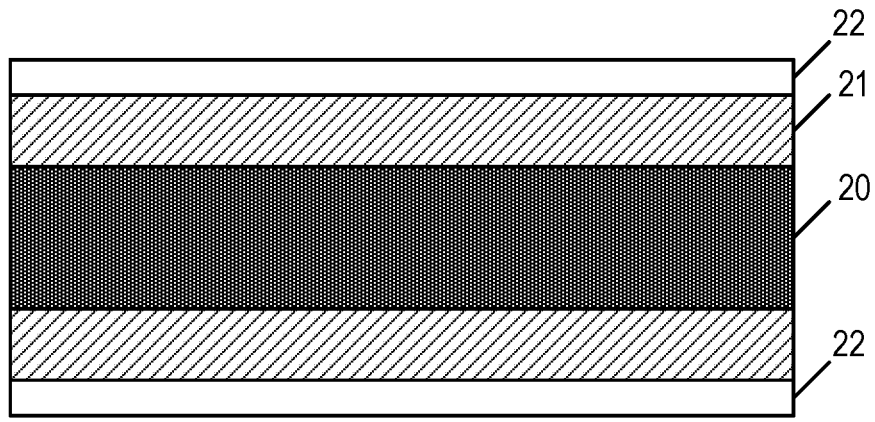
FIG. 2B is a second schematic cross section of main processes during formation of a semiconductor package structure according to an embodiment of the disclosure.
Figure 2C:
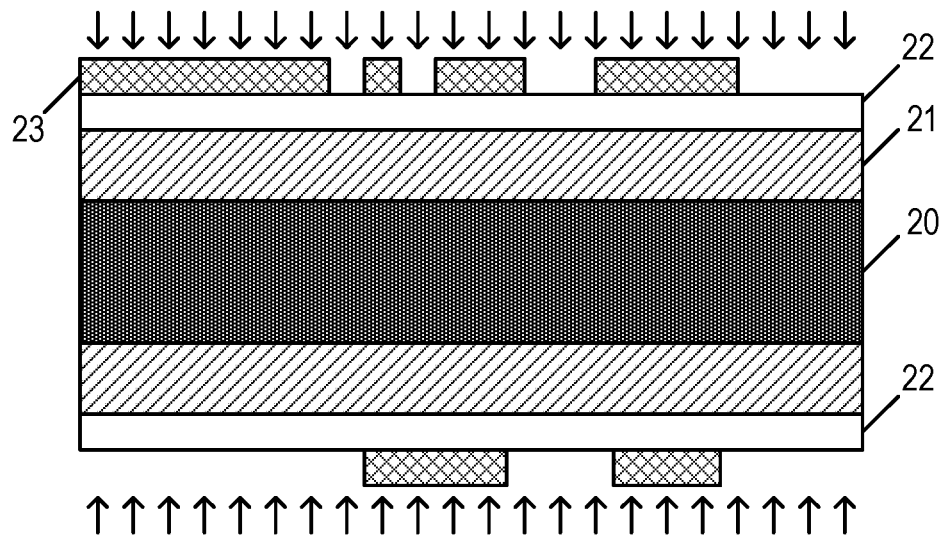
FIG. 2C is a third schematic cross section of main processes during formation of a semiconductor package structure according to an embodiment of the disclosure.
Figure 2D:
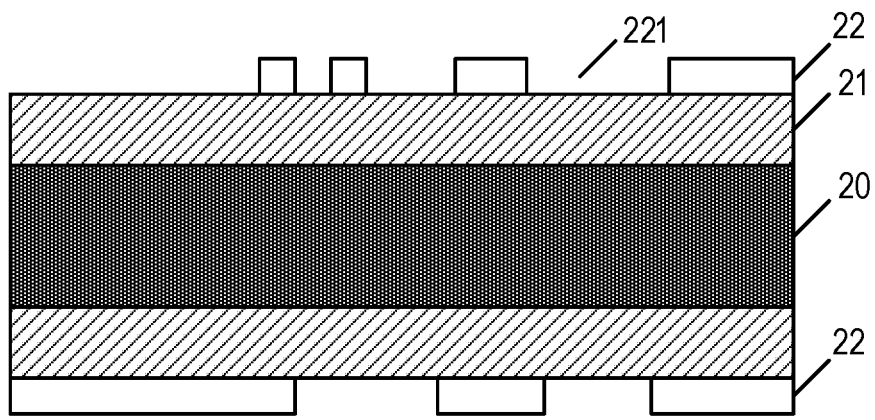
FIG. 2D is a fourth schematic cross section of main processes during formation of a semiconductor package structure according to an embodiment of the disclosure.
Figure 2E:
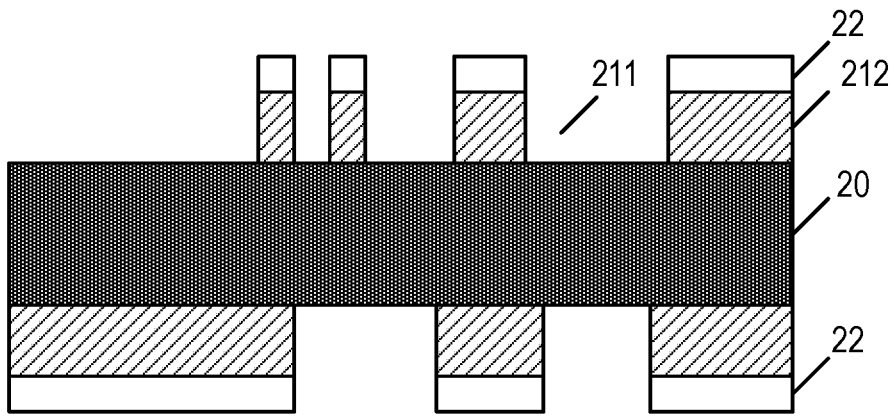
FIG. 2E is a fifth schematic cross section of main processes during formation of a semiconductor package structure according to an embodiment of the disclosure.

S12, a plurality of mutually independent conductive wires 212 are formed on the substrate 20, where a trench 211 exposing the substrate 20 is provided between adjacent conductive wires 212, as shown in FIG. 2E.

In some embodiments, forming a plurality of mutually independent conductive wires 212 on the substrate 20 specifically includes:

a conductive material 21 is formed on a first surface of the substrate 20 and a second surface opposite the first surface respectively, as shown in FIG. 2A; and the conductive material 21 is etched to form the plurality of mutually independent conductive wires 212, as shown in FIG. 2E.

In some embodiments, etching the conductive material 21 specifically includes:

a photosensitive film 22 is attached to a surface of the conductive material 21, as shown in FIG. 2B; and a patterned mask layer 23 is formed on a surface of the photosensitive film 22, where the patterned mask layer 23 is provided with openings exposing the photosensitive film 22;

the photosensitive film 22 and the conductive material 21 are etched along the openings to form the plurality of mutually independent conductive wires 212; and the patterned mask layers 23 is removed.

The conductive material 21 may include, but is not limited to, the metal material. The following will take the conductive material 21 in the form of copper as an example for description. Specifically, the substrate 20 includes the first surface and the second surface which are oppositely distributed, copper foil (that is, the conductive material 21) is formed on the first surface and the second surface of the substrate 20, and the surface of the copper foil, away from the substrate 20, is subjected to roughening, water washing, drying, etc., so as to realize surface modification of the copper foil and improve adhesion between the copper foil and the photosensitive film 22 which is subsequently formed, as shown in FIG. 2A. A thickness of the copper foil may be determined according to a height of each of the conductive wires in a preformed routing layer. Then, the photosensitive film 22 is preheated and then attached to the surface of the copper foil, such that the photosensitive film 22 is closely attached to the copper foil, and the phenomenon that the photosensitive film and the copper foil deviate from each other in a subsequent process, so as to influence a final routing pattern is avoided, as shown in FIG. 2B. Then, the patterned mask layer 23 is formed on the surface of the photosensitive film 22. The patterned mask layer 23 may be either a positive photoresist layer or a negative photoresist layer. In this embodiment, the patterned mask layer 23 in the form of the positive photoresist layer is taken as an example for description. The positive photoresist layer is provided with openings penetrating the positive photoresist layer in a direction perpendicular to a surface of the substrate 20. The positive photoresist layer is illuminated and developed in an arrow direction in FIG. 2C, to form etched windows 221 in the photosensitive film 22, and the positive photoresist layer is removed to obtain a structure shown in FIG. 2D. The etched windows 221 penetrate the photosensitive film 22 in a direction perpendicular to the surface of the substrate 20. Then, the copper foil is etched along the etching window in the photosensitive film 22 to form a plurality of trenches 211 which divide the conductive material 21 into the plurality of mutually independent conductive wires 212, as shown in FIG. 2E. Each of the plurality of trenches 211 penetrates the copper foil in the direction perpendicular to the surface of the substrate 20.

Figure 2F:
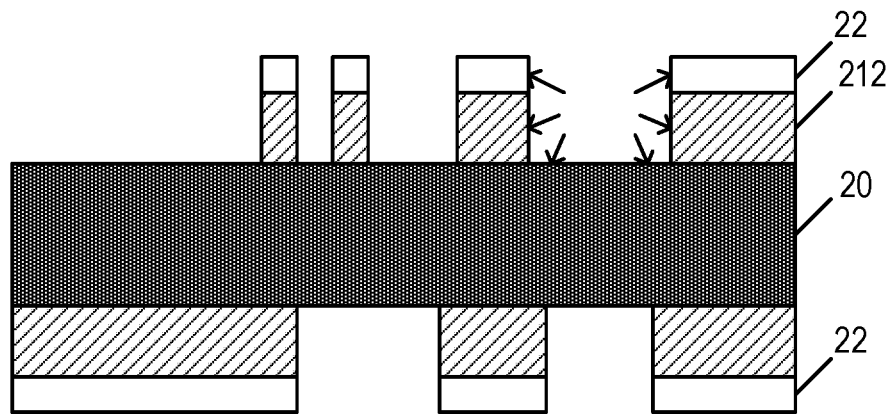
FIG. 2F is a sixth schematic cross section of main processes during formation of a semiconductor package structure according to an embodiment of the disclosure.
Figure 2G:
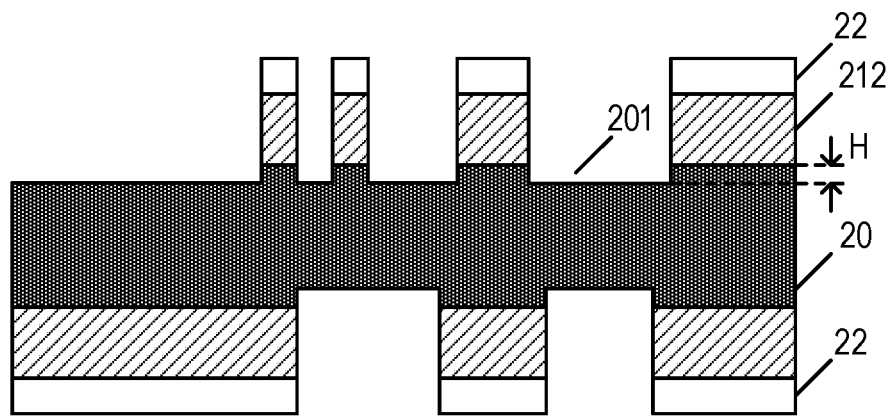
FIG. 2G is a seventh schematic cross section of main processes during formation of a semiconductor package structure according to an embodiment of the disclosure.
Figure 2H:
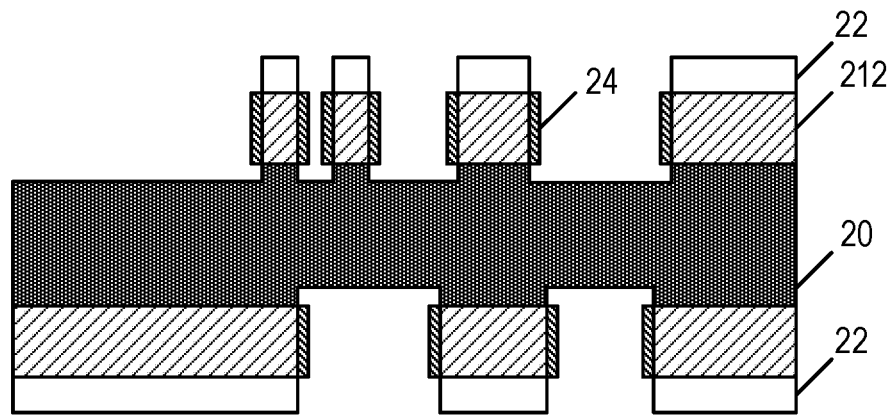
FIG. 2H is an eighth schematic cross section of main processes during formation of a semiconductor package structure according to an embodiment of the disclosure.

S13, side walls of each of the conductive wires 212 is oxidized to form a barrier layer 24, as shown in FIG. 2H.

In some embodiments, before the side walls of each of the conductive wires 212 is oxidized, the method further includes:

the substrate 20 is etched along the trench 211 to form a recess 201 connected with the trench 211 in the substrate 20, as shown in FIG. 2G.

In some embodiments, etching the substrate 20 along the trench 211 specifically includes:

the substrate 20 is cleaned by using a first gas to remove impurities on a surface of the substrate 20, as shown in FIG. 2F; and the substrate 20 is etched along the trench 211 by using a second gas, as shown in FIG. 2G.

In some embodiments, the first gas is argon and the second gas is oxygen.

Specifically, during formation of the conductive wires 212 by etching the conductive material 21, the impurities including an etchant and etching byproducts (for example, metal ions, chloride ions, sulfur ions and organic impurities) may be generated. To avoid influence of the impurities on subsequent processes, the argon gas may be used as etching gas, and a plasma etching process may be used in combination to remove the residual impurities on the substrate 20, so as to clean the substrate 20. During clean etching with the argon, a flow rate of the argon may be 1,000 sccm-2,000 sccm, an etching temperature may be 400° C., a pressure during etching is 3 torr, and a radio-frequency power is 300 W. Then, the oxygen is used as the etching gas, the plasma etching process is used in combination to micro-etch the substrate 20, and oxygen etching may effectively remove the organic impurities generated during formation of the conductive wires 212 by etching the conductive material 21 and form the recess 201. In course of micro-etching with the oxygen, a flow rate of the oxygen may be 4,000 sccm, an etching temperature may be 550° C., a pressure during etching is 5 torr, and radio-frequency power is 1,000 W.

Figure 4:
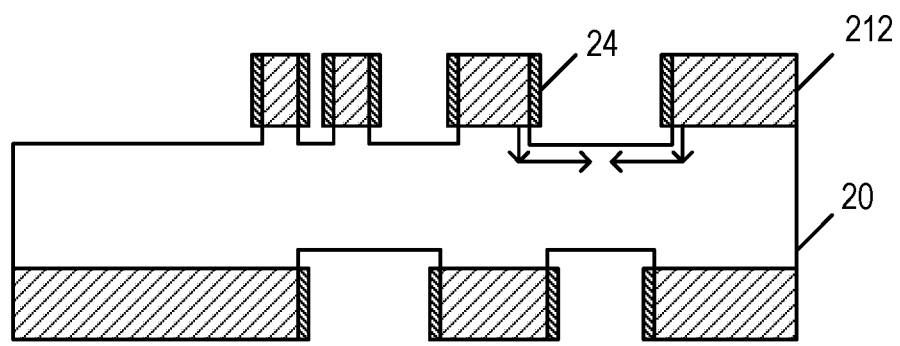
FIG. 4 is a migration path of each of conductive particles in the semiconductor package structure formed according to an embodiment of the disclosure.

FIG. 4 is a migration path of each of conductive particles in the semiconductor package structure formed according to an embodiment of the disclosure. In this embodiment, the recess 201 is formed in the substrate 20 by micro-etching the substrate 20, such that the migration path of each of conductive particles may be changed. Specifically, before the barrier layer 24 and the recess 201 are formed, once conductive particles migrate in the conductive wires 212, the migration path of each of the conductive particles is in an inner diameter direction of the trench 211, so as to be relatively short, resulting in a relatively large probability of a short circuit between adjacent conductive wires. After the barrier layer 24 and the recess 201 are formed, once conductive particles migrate, the migration path of each of the conductive particles is changed in a way through which the conductive particles are first transported downwards in a direction perpendicular to the substrate 20 (that is, a direction in which each of the conductive wires 212 points to the substrate 20) and then is transported in a radial direction of the recess 201, as shown in FIG. 4, the migration path are relatively long and there is a corner, and a probability of the short circuit between adjacent conductive wires after the conductive particles migrate is further reduced.

In the direction perpendicular to the surface of the substrate 20, a projection of the recess 201 is located between two adjacent conductive wires 212. A width (that is, an inner diameter) of the recess 201 may be equal to a width of the trench 211. In order to avoid influence on a structure of a routing layer inside the substrate 20, the recess 201 has a depth of 0.5 μm 3 μm in some embodiments.

Figure 2I:
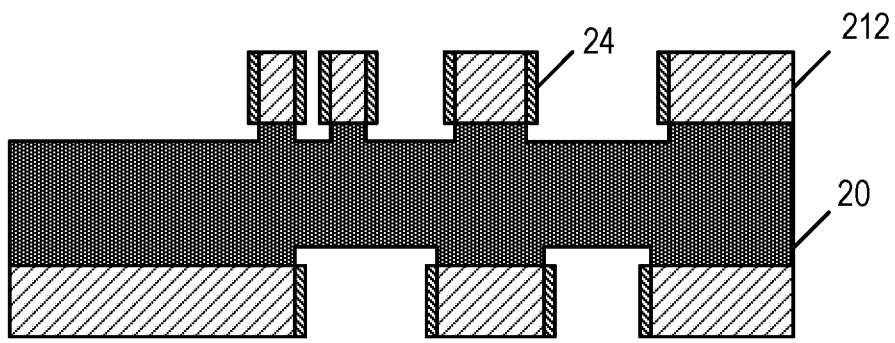
FIG. 2I is a ninth schematic cross section of main processes during formation of a semiconductor package structure according to an embodiment of the disclosure.

In some embodiments, the conductive material 21 is a metal material. The step of forming a barrier layer 24 specifically includes:

heat treatment is performed on the conductive wires 212 to form the barrier layer 24 on the side walls of each of the conductive wires 212, as shown in FIG. 2H; and the photosensitive films 22 is removed, as shown in FIG. 2I.

Specifically, after the recess 201 is formed in the substrate 20, the substrate 20 provided with the conductive wires 212 and the photosensitive film 22 is subjected to heat treatment such as baking, the metal material on the side walls of each of the conductive wires 212 undergoes an oxidation reaction at a high temperature to generate an oxide, and the oxide is used as the barrier layer 24. During high-temperature baking, since a top (that is, a surface, away from the substrate 20, of each of the conductive wires 212) of each of the conductive wires 212 is covered with the photosensitive film 22, so as to guarantee the top of each of the conductive wires 212 is not oxidized. During baking, a thickness of the barrier layer 24 may be adjusted by controlling baking time, a flow rate of oxygen during baking, a baking temperature, etc. In an embodiment, the baking temperature may be set at 150° C. and the baking time is set at 1 h, so as to guarantee formation of the stable barrier layer. A person of ordinary skill in the art may adjust the thickness of the barrier layer 24 according to actual needs, for example, by controlling the baking time and the flow rate of the oxygen during baking.

Figure 2J:
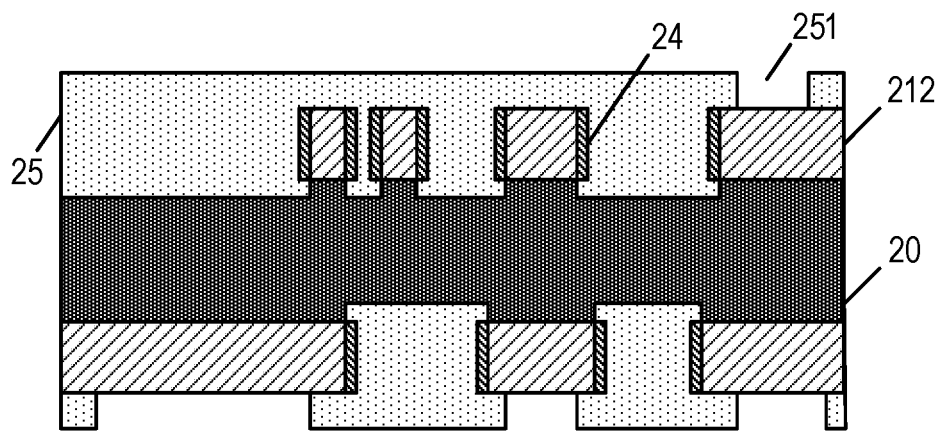
FIG. 2J is a tenth schematic cross section of main processes during formation of a semiconductor package structure according to an embodiment of the disclosure.

S14, a solder mask 25 at least filling the trench 211 is formed, as shown in FIG. 2J.

In some embodiments, forming a solder mask 25 at least filling the trench 211 specifically includes:

the solder mask 25 which fills the trench 211 and the recess 201 and covers the barrier layer 24 and a surface of at least one of the conductive wires 212 is formed; and the solder mask 25 is etched to form a contact hole 251 exposing a portion of the conductive wires 212.

Specifically, after the barrier layer 24 is formed and the photosensitive films 22 is removed, the solder mask 25 is deposited such that the solder mask 25 fills the trench 211 and the recess 201 and covers the barrier layer 24 and the surface of at least one of the conductive wires 212. Then, as required by welding, a portion of the solder mask 25 is etched to form a contact hole 251 exposing the portion of the conductive wires 212, as shown in FIG. 2J and FIG. 3. The solder mask 25 is used to guarantee a morphology of at least one of the conductive wires 212, and electrical insulation between adjacent conductive wires, and prevent a welded surface (that is, the top) of each of the conductive wires 212 from being oxidized.

In some embodiments, a distance between adjacent conductive wires 212 is less or equal to 20 μm. The method for forming a semiconductor package structure provided in this embodiment is also applicable to the case where the distance between adjacent conductive wires 212 is longer than 20 μm.

Furthermore, this embodiment further provides the semiconductor package structure. The semiconductor package structure provided in this embodiment may be formed by the method shown in FIG. 1 and FIGS. 2A-2J, and a schematic diagram of the semiconductor package structure provided in this embodiment may be seen in FIG. 2J and FIG. 3. As shown in FIGS. 2A-2J and FIG. 3, the semiconductor package structure includes:

a substrate 20;

a plurality of mutually independent conductive wires 212, located on the substrate 20, where a trench 211 exposing the substrate 20 is provided between adjacent conductive wires 212;

a barrier layer 24, covering side walls of each of the conductive wires 212; and a solder mask 25, located on the substrate 20 and at least fills the trench 211.

Specifically, the conductive wires 212 are used to transport an electrical signal in a semiconductor. The solder mask 25 is used to guarantee a morphology of each of the conductive wires 212, and electrical insulation between adjacent conductive wires, and prevent a welded surface (that is, a top) of each of the conductive wires 212 from being oxidized. The barrier layer 24 may prevent electromigration of conductive particles in the conductive wires 212, so as to avoid a short circuit between adjacent conductive wires 212.

In some embodiments, each of the conductive wires 212 is made from a metal material, and the barrier layer 24 is made from a metal oxide.

In this embodiment, the barrier layer 24 is formed by oxidizing the side walls of each of the conductive wires 212.

In some embodiments, a recess 201 which is located between adjacent conductive wires 212 and is connected with the trench 211 is provided in the substrate 20; and the solder mask 25 fills the trench 211 and the recess 201 and covers the barrier layer 24 and a portion of a surface of each of the conductive wires 212.

The recess 201 has a depth of 0.5 μm-3 μm in some embodiments.

The recess 201 is used to a change migration path of each of the conductive particles in the conductive wires 212. Specifically, before the barrier layer 24 and the recess 201 are formed, once conductive particles migrate in the conductive wires 212, the migration path of each of the conductive particles is in an inner diameter direction of the trench 211, so as to be relatively short, resulting in a relatively large probability of a short circuit between adjacent conductive wires. After the barrier layer 24 and the recess 201 are formed, once conductive particles migrate, the migration path of each of the conductive particles is changed in a way through which the conductive particles are first transported downwards in a direction perpendicular to the substrate 20 (that is, a direction in which each of the conductive wires 212 points to the substrate 20) and then is transported in a radial direction of the recess 201, as shown in FIG. 4, the migration path is relatively long and there is a corner, and a probability of the short circuit between adjacent conductive wires after the conductive particles migrate is further reduced.

In some embodiments, a distance between adjacent conductive wires 211 is less or equal to 20 μm.

In other embodiments, the distance between adjacent conductive wires 211 is less or equal to 20 μm.

According to the semiconductor package structure and the forming method thereof provided by this embodiment, the barrier layer is formed by oxidizing the side walls of each of the conductive wires; on the one hand, the electromigration of the conductive particles in each of the conductive wires may be blocked by the barrier layer, such that the probability of the short circuit between adjacent conductive wires may be reduced; and on the other hand, the barrier layer is formed by directly oxidizing each of the conductive wires, a process is simple, manufacturing steps of the semiconductor package structure are simplified, and production efficiency of the semiconductor package structure is improved.

What is described above is merely a preferred embodiment of the disclosure. It shall be noted that for a person of ordinary skill in the art, they may make several improvements and polishing on the premise without deviating from a principle of the disclosure, and these improvements and polishing shall be integrated as falling within the protection scope of the disclosure.

What is claimed is:

1. A method for forming a semiconductor package structure, comprising:
   providing a substrate;
   forming a plurality of mutually independent conductive wires on the substrate, wherein a trench exposing the substrate is provided between adjacent conductive wires;
   oxidizing side walls of each of the conductive wires to form a barrier layer; and
   forming a solder mask at least filling the trench,
   before the side walls of each of the conductive wires is oxidized, the forming method further comprises:
   etching the substrate along the trench to form a recess connected with the trench in the substrate, comprising: cleaning the substrate by using a first gas to remove impurities on a surface of the substrate; and etching the substrate along the trench by using a second gas.

2. The method for forming the semiconductor package structure according to claim 1, wherein forming the plurality of mutually independent conductive wires on the substrate comprises:
   forming a conductive material on a first surface of the substrate and a second surface opposite the first surface respectively; and
   etching the conductive material to form the plurality of mutually independent conductive wires.

3. The method for forming the semiconductor package structure according to claim 2, wherein etching the conductive material comprises:
   attaching a photosensitive film to a surface of the conductive material;
   forming a patterned mask layer on a surface of the photosensitive film, wherein the patterned mask layer is provided with openings exposing the photosensitive film;
   etching the photosensitive film and the conductive material along the openings to form the plurality of mutually independent conductive wires; and
   removing the patterned mask layer.

4. The method for forming the semiconductor package structure B according to claim 3, wherein the conductive material is a metal material; and forming the barrier layer comprises:
   performing heat treatment on the conductive wires to form the barrier layer on the side walls of each of the conductive wires; and
   removing the photosensitive film.

5. The method for forming the semiconductor package structure according to claim 4, wherein forming the solder mask at least filling the trench specifically comprises:
   forming the solder mask which fills the trench and the recess and covers the barrier layer and a surface of each of the conductive wires; and
   etching the solder mask to form a contact hole exposing a portion of the conductive wires.

6. The method for forming the semiconductor package structure according to claim 1, wherein the first gas is argon and the second gas is oxygen.

7. The method for forming the semiconductor package structure according to claim 1, wherein the recess has a depth of 0.5 µm-3 µm.

8. The method for forming the semiconductor package structure according to claim 1, wherein a distance between the adjacent conductive wires is less or equal to 20 µm.

* * * * *